US008614145B2

(12) United States Patent
Hummler

(10) Patent No.: US 8,614,145 B2
(45) Date of Patent: Dec. 24, 2013

(54) THROUGH SUBSTRATE VIA FORMATION PROCESSING USING SACRIFICIAL MATERIAL

(75) Inventor: Klaus Hummler, Ballston Lake, NY (US)

(73) Assignee: Sematech, Inc., Albany, NY (US)

( * ) Notice: Subject to any disclaimer, the term of this patent is extended or adjusted under 35 U.S.C. 154(b) by 119 days.

(21) Appl. No.: 13/325,191

(22) Filed: Dec. 14, 2011

(65) Prior Publication Data

US 2013/0157436 A1  Jun. 20, 2013

(51) Int. Cl.
*H01L 21/28* (2006.01)
(52) U.S. Cl.
USPC ........... 438/667; 438/421; 438/424; 438/666; 438/672; 257/621; 257/E21.597
(58) Field of Classification Search
USPC .......... 438/421, 424, 666, 667, 672; 257/621, 257/E21.597
See application file for complete search history.

(56) References Cited

U.S. PATENT DOCUMENTS

| 5,202,754 | A | 4/1993 | Bertin et al. |
| 5,766,984 | A | 6/1998 | Ramm et al. |
| 2009/0127667 | A1 | 5/2009 | Iwata |
| 2009/0267194 | A1 | 10/2009 | Chen |
| 2010/0032809 | A1 | 2/2010 | Collins et al. |
| 2010/0130008 | A1* | 5/2010 | Smith ........................ 438/667 |
| 2010/0133704 | A1 | 6/2010 | Marimuthu et al. |
| 2010/0148316 | A1 | 6/2010 | Kim et al. |
| 2010/0167534 | A1 | 7/2010 | Iwata |
| 2011/0073858 | A1 | 3/2011 | Ding et al. |
| 2011/0177655 | A1 | 7/2011 | Chiou et al. |
| 2011/0185330 | A1 | 7/2011 | Collins et al. |
| 2011/0237068 | A1* | 9/2011 | Fournel et al. ................ 438/652 |
| 2011/0266691 | A1 | 11/2011 | Lin et al. |

OTHER PUBLICATIONS

Ramm, P. et al. "Three Dimensional Metallization for Vertically Integrated Circuits", Journal of Microelectronic Engineering, vol. 37, No. 38 (1997).
Yole Developpement Brochure, "3D-IC & TSV Interconnects: 2010 Reports" (2010).

* cited by examiner

*Primary Examiner* — Thanh V Pham
(74) *Attorney, Agent, or Firm* — Kevin P. Radigan, Esq.; Heslin Rothenberg Farley & Mesiti P.C.

(57) ABSTRACT

A method is provided for establishing through substrate vias (TSVs) within a substrate. The method includes: forming at least one recess in a front-side of a wafer; filling, at least partially, the at least one recess with a sacrificial material from the front-side of the wafer; thinning the wafer from a back-side to reveal the at least one recess at least partially filled with the sacrificial material; removing from the back-side of the wafer the sacrificial material from the at least one recess; and filling the at least one recess from the back-side of the wafer with a conductive material to provide the at least one through substrate via.

11 Claims, 12 Drawing Sheets

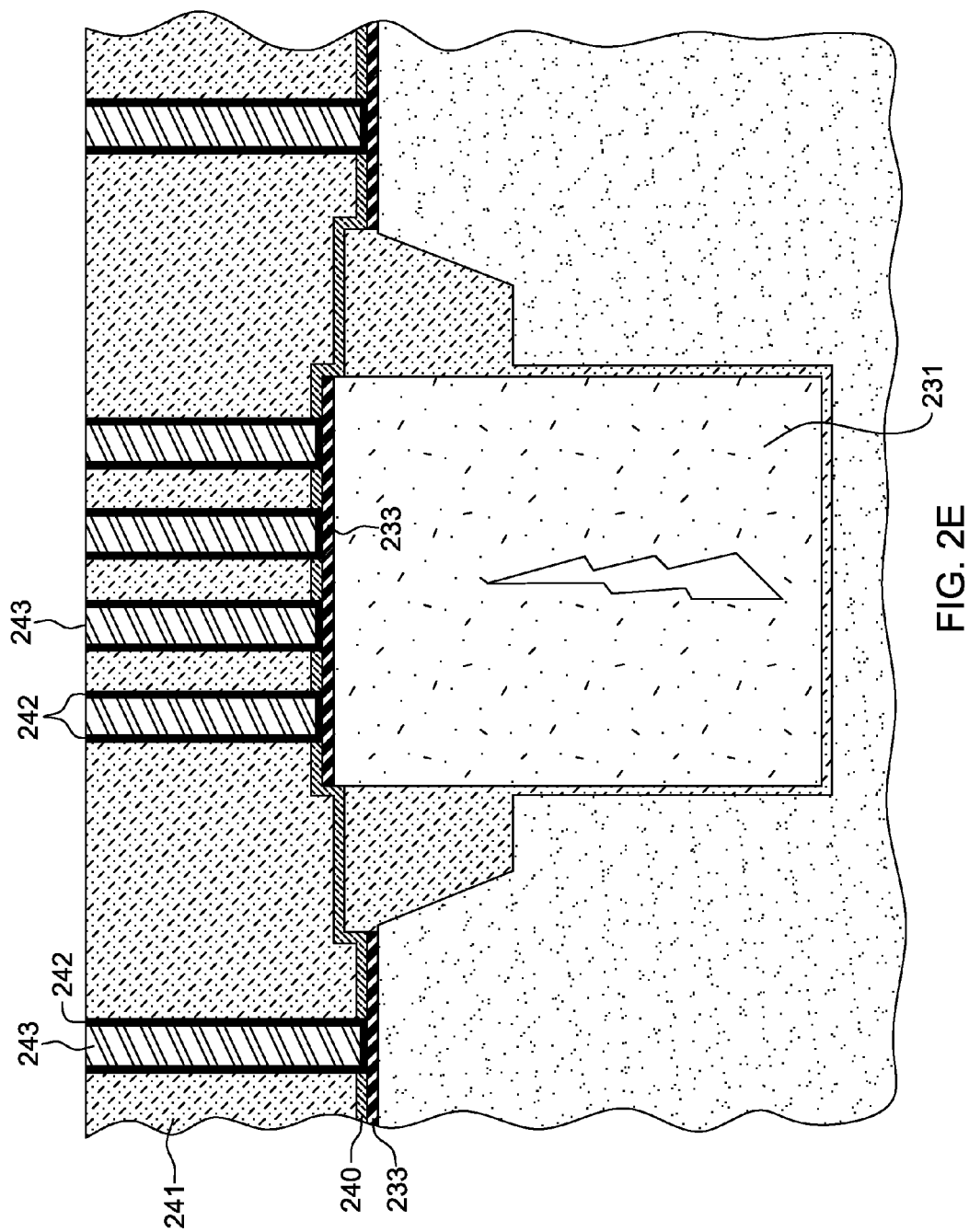

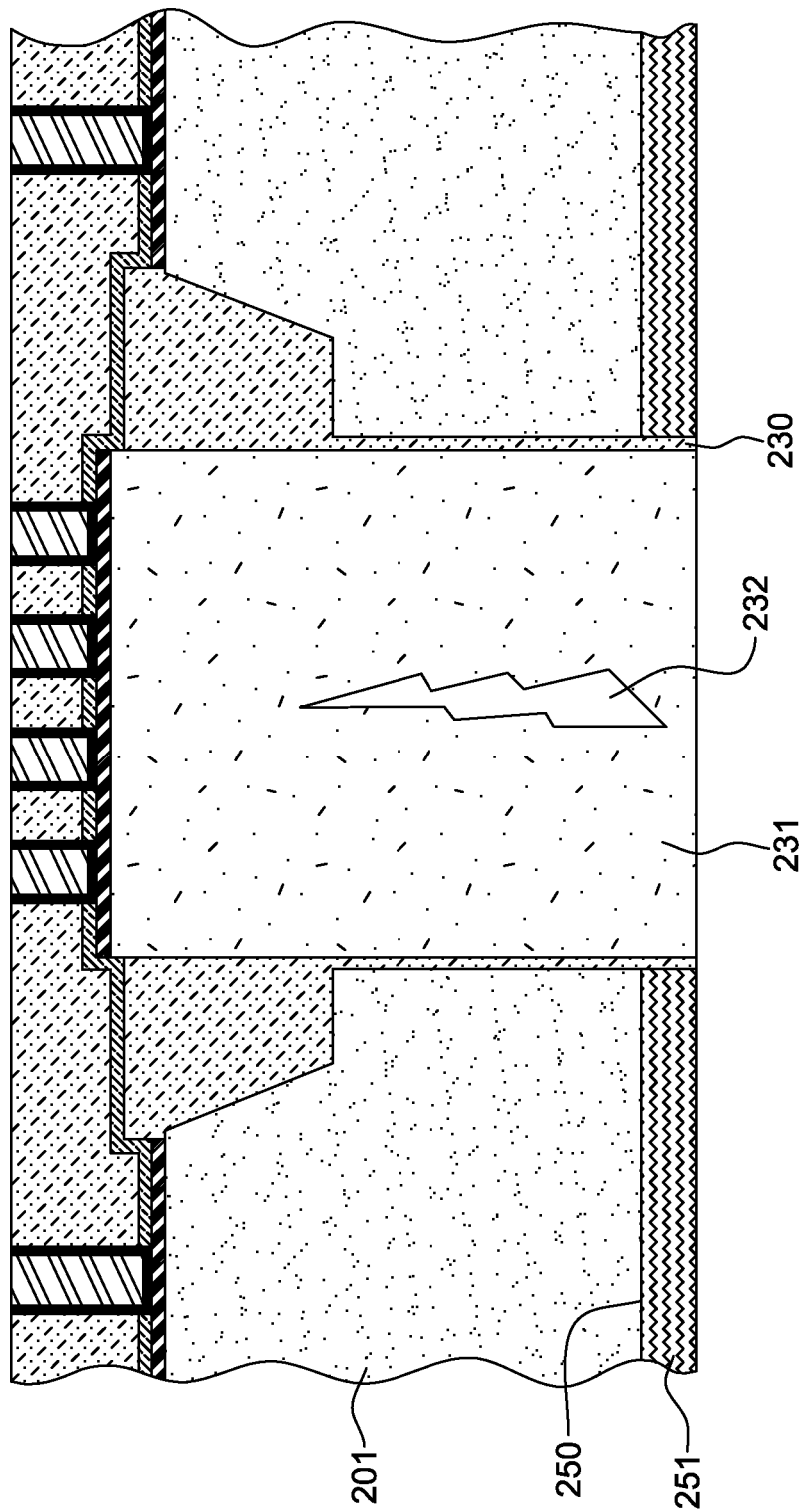

THROUGH SUBSTRATE VIA FORMATION PROCESSING USING SACRIFICIAL MATERIAL

BACKGROUND

This invention relates generally to semiconductor or other electrical device fabrication, and more particularly, to fabrication of structures with through substrate vias, including semiconductor structures with through substrate vias, and other electrical devices, such as microelectromechanical systems (MEMS), manufactured on a substrate with through substrate vias.

As semiconductor scaling faces difficulty at device dimensions approaching atomic scale, three-dimensional device integration offers a method for increasing density of semiconductor devices within a device. In three-dimensional integration, a plurality of semiconductor die or chips may be vertically stacked with electrical contacts disposed on both the active surfaces and the back surfaces of the chips so as to increase electrical interconnections between the stacked chips.

Through substrate vias (TSVs) (or through silicon vias) facilitate, at least in part, this electrical interconnection. Typically, a through substrate via extends from the active surface or side (for example, from a line-level metal wiring structure on the front surface, which is typically a first metal wiring level in a metal interconnect structure) to the back surface or side of the semiconductor die or chip. These through substrate vias provide electrical connection paths through the substrate of the semiconductor chip, for example, to facilitate electrically interconnecting a plurality of stacked semiconductor chips.

BRIEF SUMMARY

In one aspect, provided herein is a novel method for establishing one or more through substrate vias (TSVs) through a substrate. The method includes: forming at least one recess in a first side of a wafer; filling, at least partially, the at least one recess with a sacrificial material; thinning the wafer from a second side to reveal the at least one recess at least partially filled with the sacrificial material; removing, from the second side of the wafer, the sacrificial material from the at least one recess; and filling the at least one recess from the second side of the wafer with a conductive material to provide the at least one through substrate via.

In another aspect, provided herein is a method of forming a structure which includes: forming at least one recess in a front-side of a wafer; filling, at least partially, the at least one recess with a sacrificial material; forming one or more devices at the front-side of the wafer; thinning the wafer from a back-side to reveal the at least one recess at least partially filled with the sacrificial material, the thinning being subsequent to the forming of the one or more devices at the front-side of the wafer; removing, from the back-side of the wafer, the sacrificial material from the at least one recess; and filling the at least one recess from the back-side of the wafer with a conductive material to provide at least one through substrate via (TSV) through the wafer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2E depicts the semiconductor structure of FIG. 2D, after mid-of-the-line (MOL) processing to form (at the front-side) electrical contacts to a silicide layer in the sacrificial material disposed within the recess, in accordance with one or more aspects of the present invention;

FIG. 2G depicts the semiconductor structure of FIG. 2F, after performing back-side processing, including dielectric deposition and opening of the through substrate via at the back-side of the wafer, in accordance with one or more aspects of the present invention;

DETAILED DESCRIPTION

Figure 1:
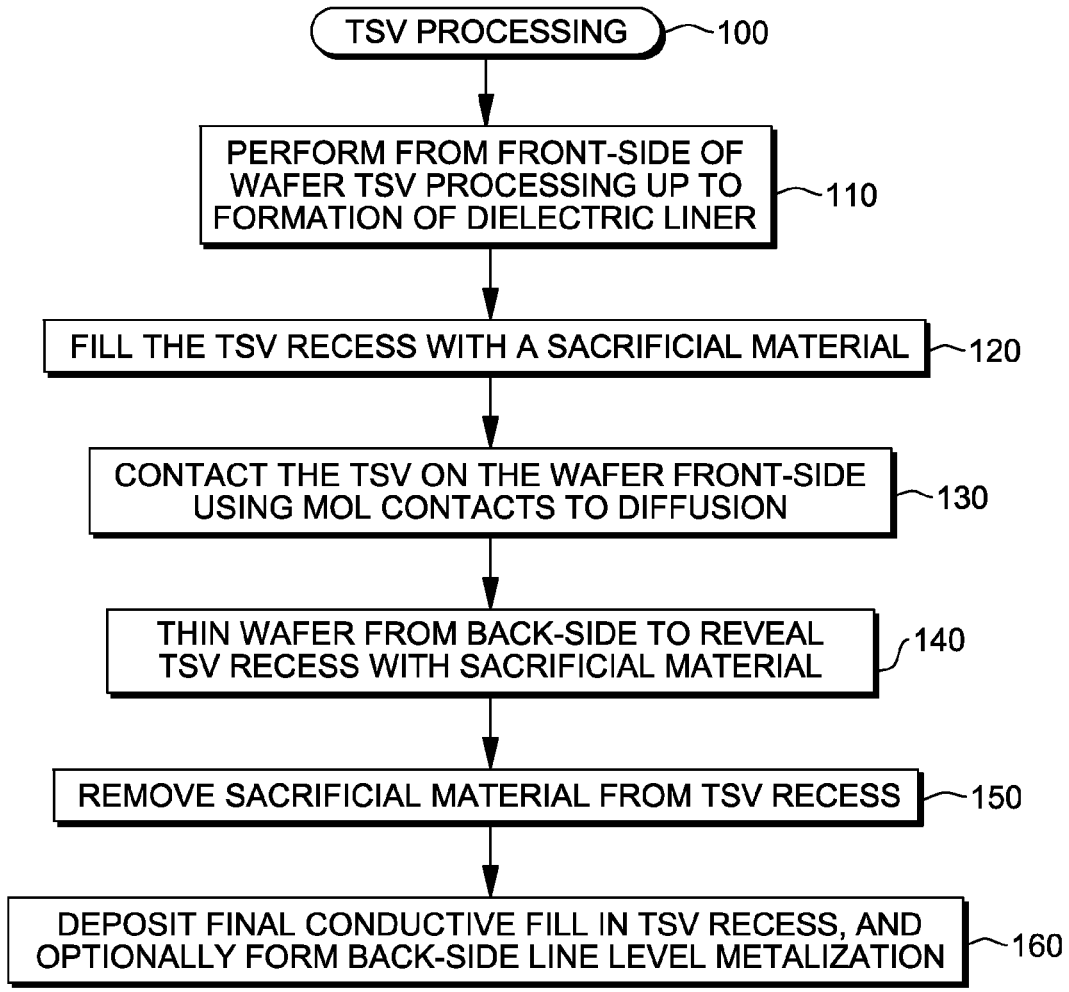
FIG. 1 depicts one embodiment of a process for providing one or more through substrate vias (TSVs) through a substrate, in accordance with one or more aspects of the present invention.

As noted, three-dimensional circuit integration using through substrate vias (TSVs) (or through silicon vias) is an emerging technology which will result in performance, power and reliability enhancements, and ultimately, cost benefits, compared with traditional, two-dimensional integration or other forms of three-dimensional integration. A variety of approaches may be employed in integrating TSVs into semiconductor device fabrication and packaging flows. These include:

TSV-first: In this approach, TSVs are processed and filled with electrically-conducting material from the wafer front-side before active device processing, and the TSVs are later revealed by thinning and electrically contacting from the wafer back-side.

TSV-mid: In this approach, TSVs are processed and filled with electrically-conducting material from the wafer front-side after mid-of-the-line (MOL) contact-level processing, and before or at any level during back-end-of-line (BEOL) processing (such as at, for example, metal-level 5 of a 9 BEOL metal-level structure). The TSVs are later revealed by thinning and electrically contacting from the wafer back-side.

TSV-last: In this approach, TSVs are processed and filled with electrically-conducting material from the wafer front-side after BEOL processing is completed. The TSVs are revealed by electrically thinning and electrically contacting from the wafer back-side.

TSV-last—back-side: In this approach, TSVs are processed and filled with electrically-conducting material from the wafer back-side, after BEOL processing over the front-side, and wafer thinning.

Each of the above-noted approaches has unique advantages and disadvantages, with the largest differences being found between the TSV-first and the remaining integration approaches. In the TSV-first approach, because it is first in the processing flow, high-temperature processes can be used to form the TSV. This relates especially to the dielectric, where thermal oxide may be employed. However, with this approach, the conductive TSV fill is subjected to and present during all subsequent, active device processing, and therefore, copper does not work well for the TSV fill because of the subsequent high-temperature process steps, thermal expansion, stress and contamination concerns that may arise with such a structure during active device processing. Alternative fills, such as tungsten or polysilicon, exhibit significantly higher resistance than low-resistance conductive materials, such as copper, and may still lead to contamination and stress issues during the active device processing steps.

Contrasted with this, the TSV-mid, TSV-last, and TSV-last—back-side approaches allow copper as the electrically conductive fill since there are limited process temperatures after TSV formation using these approaches. However, the dielectric and other TSV processes are limited in temperature and overall thermal budget, due to the potential negative effects on the existing active devices, such as transistor characteristics. In addition, TSV lithography, etching and filling are disruptive to MOL/BEOL structures, and potentially damaging the to the structures. In the case of TSV-mid, and TSV-last, etching through the MOL/BEOL stack might cause undercut and other sidewall issues. In the case of TSV-last—back-side, etch stop and dielectric liner open are very challenging unit processes.

Generally stated, disclosed herein is a new TSV formation approach, which may be characterized as TSV-first-and-last. This formation approach provides a novel integration flow which combines the major advantages of the various above-noted TSV process flows, without creating any significant disadvantages.

One or more through substrate vias (TSVs) through a substrate or wafer are provided herein by: forming at least one recess in a first side of a wafer, filling, at least partially, the at least one recess with a sacrificial material from the first side of the wafer; thinning the wafer from a second side to reveal the at least one recess at least partially filled with the sacrificial material; removing from the second side of the wafer, the sacrificial material from the at least one recess; and filling the at least one recess from the second side of the wafer with a conductive material to provide the at least one through substrate via. In the implementations described below, the first side is a front-side (or surface) of the wafer, and the second side is a back-side (or surface) of the wafer, wherein the front-side is an active device side of the wafer. Further, the recess formation and filling thereof with the sacrificial material are performed before active device (e.g., transistor) processing, and the removing and the filling with the conductive material are performed after the active device processing. As an optional enhancement, filling, at least partially, the recess with the sacrificial material, may include filling the recess(es) with the sacrificial material so as to create one or more fill voids (for example, one or more unexposed voids within the sacrificial material), which subsequently facilitate fast removal of the sacrificial material from the recess from the back-side of the wafer, as described herein. Advantageously, TSV contacting is from the front side, using (for example) standard MOL contacts to diffusion, and if desired, dual damascene processing may be employed to create the conductive TSV(s) along with a first-level, back-side metallization.

More particularly, and referring to the TSV processing 100 of FIG. 1, through substrate vias may be fabricated, in accordance with one or more aspects of the present invention, by performing TSV processing up to the formation of the dielectric liner within the recesses, before active device (e.g., transistor) processing 110. This TSV processing is from the front-side of the wafer, and allows for ready processing on a pristine wafer, as well as high-temperature recipes for the formation of the dielectric liner. This also results in cost savings because, in one embodiment, this front-side processing may be integrated with the shallow-trench isolation (STI) process module, to have more synergies than were it integrated with MOL or BEOL processing modules, as in certain of the above-described TSV approaches.

Next, the TSV recesses are filled with a sacrificial material 120. This material can be chosen to be a low-stress material, and have a low-cost of ownership, etc. One possible choice is polysilicon, but other materials could also be employed. By filling the TSV recesses with polysilicon, standard transistor, MOL and BEOL processings may be subsequently employed, without the risk of excessive stress or contamination through the TSV recesses. Note that any cost increase due to the sacrificial fill and its removal are readily compensated by cost reductions achieved in other process areas employing the TSV formation approach disclosed herein.

Contacts to the TSV recesses with sacrificial material may be made on the wafer front-side using standard MOL contacts to diffusion (CA) 130. This will lead to cost reduction in comparison with other TSV approaches, since the MOL process is not disrupted in any way. Forming the TSV recesses with sacrificial material at substrate level, and contacting the TSV recesses with sacrificial material with MOL contacts to diffusion frees design space on the first metallization layer (M1), as well as higher BEOL levels, which can result in a significant increase in available routing space, that is, where through substrate vias are employed.

The wafer is then thinned 140, revealing the TSV recesses with sacrificial material, and the sacrificial material is removed 150, and the final, low-resistance conductive fill is deposited 160. In one embodiment, this conductive fill may comprise copper. Advantageously, because of the use of a benign, temporary TSV recess fill material, there is no risk of wafer contamination during thinning and TSV reveal processes. In contrast to a "TSV-last—back-side" approach, there is also no need to stop a deep silicon reactive ion etch process on a front-side metal, or to open the dielectric liner deep inside the TSV recess. Since the contact to the front side is ready for conductive material deposition after the sacrificial fill is stripped, a dual damascene process, together with a back-side, line-level metallization can be realized, which can result in additional cost savings. Note also that, if desired, after the sacrificial material has been removed, the TSV side wall could be lined with a conductive material rather than completely filling the recess, which would provide sufficient electrical conductivity, but reduce thermo-mechanical stress. Such a partial fill of the TSV recess is not easy with the TSV approaches summarized above (except for TSV-last—back-side) because they all require planarization steps which do not work with a hole in the center of the TSV (i.e., the so-called "annular" TSV).

FIGS. 2A-2J depict, by way of example only, one detailed process embodiment for TSV formation, in accordance with one or more aspects of the present invention. Those skilled in the art will note that the concepts disclosed herein can be readily adapted to other process flows than that depicted in FIGS. 2A-2J. For example, the initial etching steps of FIGS. 2A & 2B could be performed earlier or later in the semiconductor device fabrication process.

Figure 2A:
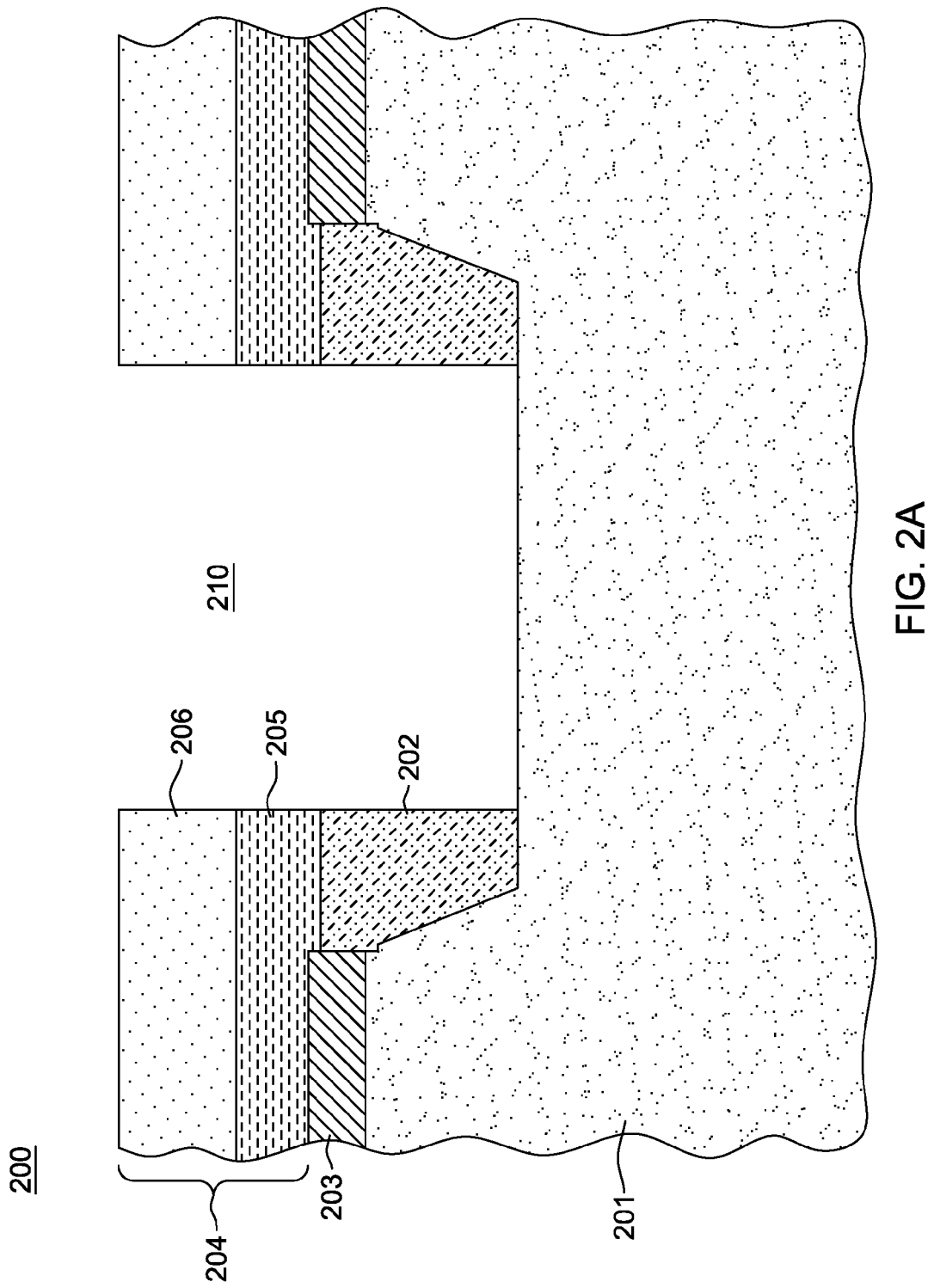
FIG. 2A depicts (by way of example only) a partial cross-sectional elevational view of a front-side of a semiconductor structure comprising a wafer with a patterned mask opening in a shallow trench isolation region, to facilitate through substrate via formation, in accordance with one or more aspects of the present invention.

FIG. 2A illustrates one embodiment of a semiconductor structure 200 comprising a substrate (or wafer) 201 (e.g., a silicon wafer) having undergone shallow trench isolation processing at the front-side of the wafer, resulting in the formation of one or more STI-oxide trenches 202, and one or more silicon nitride (SiN) pad(s) 203 at the front surface of wafer 201. After completion of (or integrated with) the STI process module, TSV lithography and mask opening is performed. Specifically, in the depicted example, after completion of STI formation, a mask 204 comprising, in one example, a TSV TEOS hard mask 205, and a TSV resist 206, is deposited, and patterned by lithography. Note that in an alternate embodiment, rather than employing a TEOS hard mask, a thicker resist could be employed as the mask. This thicker resist might be 1-2 microns thick, or greater, depending upon the depth of the TSV to be formed. The hard mask and STI are then etched, in one embodiment, in one step to form a recess or opening 210 through the mask and STI. The hard mask etch (or STI etch in the case of thick resist) stops on the silicon wafer 201, as illustrated in FIG. 2A. Note that, in one embodiment, these initial TSV process steps occur prior to formation of the active devices at, for example, the front-side of the wafer.

Figure 2B:
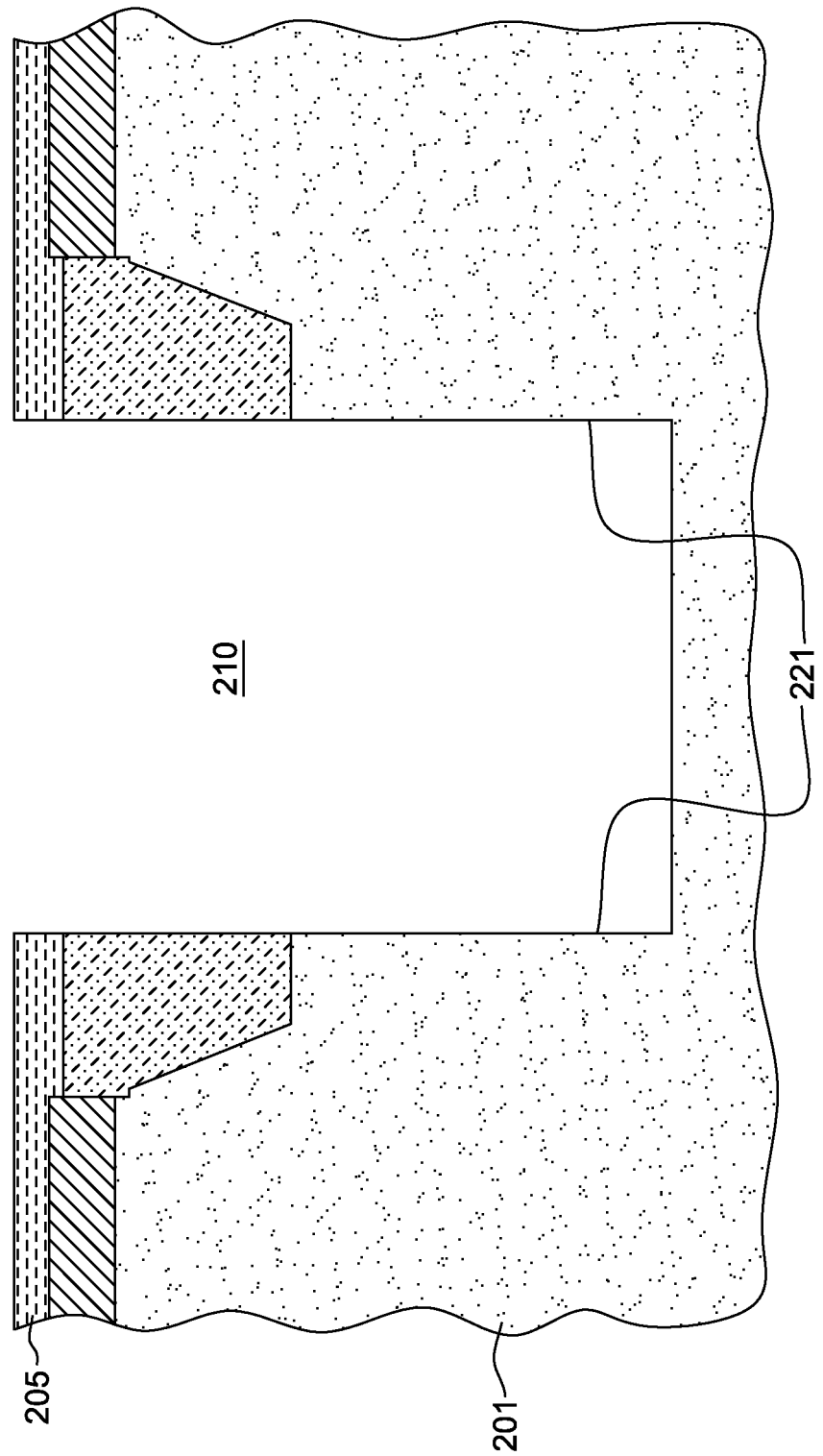
FIG. 2B depicts the semiconductor structure of FIG. 2A, after formation of a recess in the front-side of the wafer, in accordance with one or more aspects of the present invention.

Referring to FIG. 2B, a deep silicon RIE or BOSCH etch is performed to form the TSV recess 210 extending into silicon wafer 201. Note that the resultant profile comprises vertical side walls 221 or side walls with a slightly, re-entrant profile (not shown) to facilitate conductive fill from the wafer back-side. Note in this regard, that the subsequent dielectric and temporary fill processes are able to accommodate a re-entrant profile. The resist 205 is then stripped after the hard mask etch or after the silicon RIE (in the case of a thick resist).

Figure 2C:
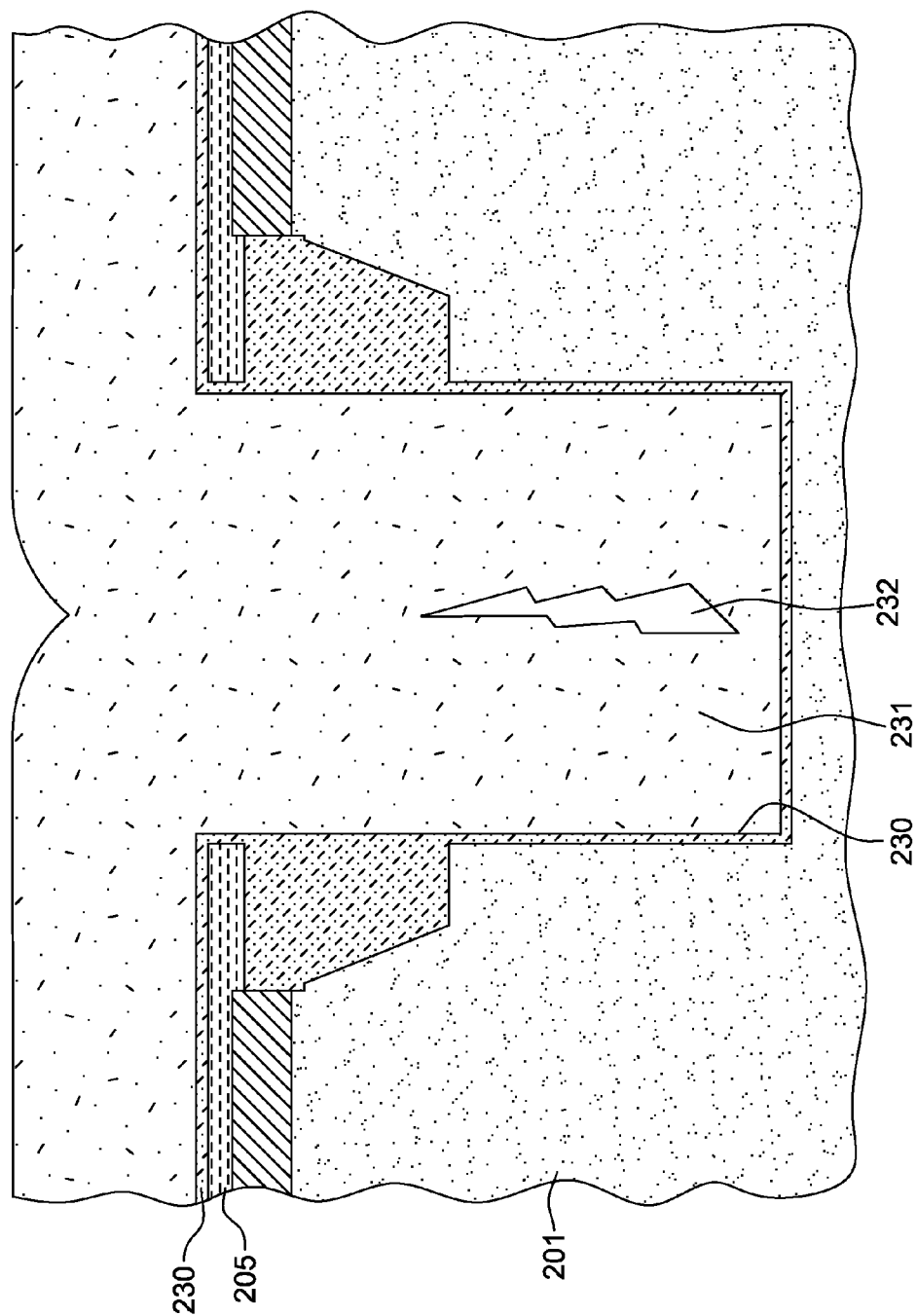
FIG. 2C depicts the semiconductor structure of FIG. 2B, after providing a dielectric liner and filling, at least partially, the recess with a sacrificial material, in accordance with one or more aspects of the present invention.

FIG. 2C illustrates the semiconductor structure of FIG. 2B, after a dielectric liner 230 has been formed, for example, by thermal oxide or oxy-nitride formation and/or CVD. if desired, a non-conformal oxide deposition could be added to create a re-entrant TSV profile (not shown) for easier conductive fill from the back-side of wafer 201. The TSV recess is then at least partially filled with a sacrificial material 231, which in one example, might comprise CVD polysilicon. The deposition process could intentionally be non-conformal to pinch off the sacrificial material at the top of the TSV recess, and create one or more center-disposed, fill voids 232 within the TSV-filled recess. These fill voids will facilitate faster removal of the sacrificial material from the recesses subsequently in the process flow. The fill process can be controlled so that the position of the void(s) can be engineered such that no fill void is present at the top STI level on the front-side of the wafer.

Figure 2D:
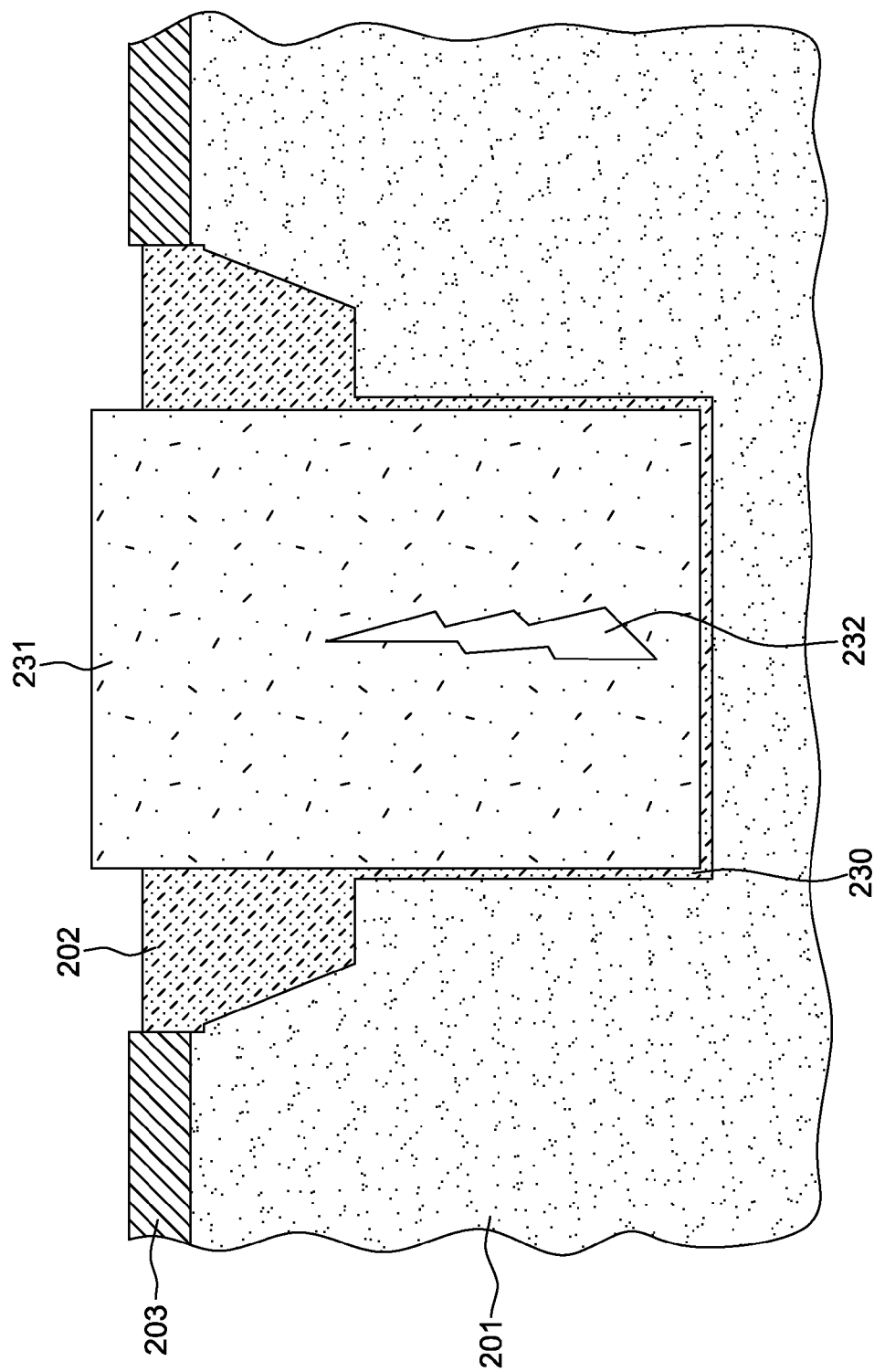
FIG. 2D depicts the semiconductor structure of FIG. 2C, after etching back the sacrificial material on the front-side of the wafer, and removing remnants of the hard mask employed in forming the recess, in accordance with one or more aspects of the present invention.

As illustrated in FIG. 2D, through CMP and/or etch-back, the sacrificial material 231 (e.g., polysilicon) and dielectric liner 230, as well as any optional hard mask 205 (see FIG. 2C) are planarized back to the pad SiN 203. The device fabrication process then continues, with typical post-STI FEOL, MOL and BEOL process flows.

In the example depicted in FIG. 2E, a silicide layer 233 has been formed within the sacrificial material, and selectively at the front surface of the silicon wafer 201, to improve electrical contacts where desired. This silicide layer may comprise, for example, cobalt silicide or nickel silicide. A barrier layer 240 is introduced to contain any contaminants in the BEOL from reaching the silicon wafer and destroying any active devices formed within the wafer. The electrical contacts comprise a conductive barrier layer 242 and conductive contacts 243, which may comprise, in one example, copper. Advantageously, in accordance with this aspect of Applicants' invention, the diffusion contacts can land on the sacrificial material, filling the TSV recess, and in one example, electrically contact the silicide layer 233 within the TSV recess formed at the front-side of the wafer. This process step results in freeing design space on the front-side metal one level that would otherwise be needed to electrically contact through to the TSV using the above-described TSV formation approaches. In accordance with the process steps disclosed herein, there is no breech to the mid-end-of-line (MOL) layer.

Figure 2F:
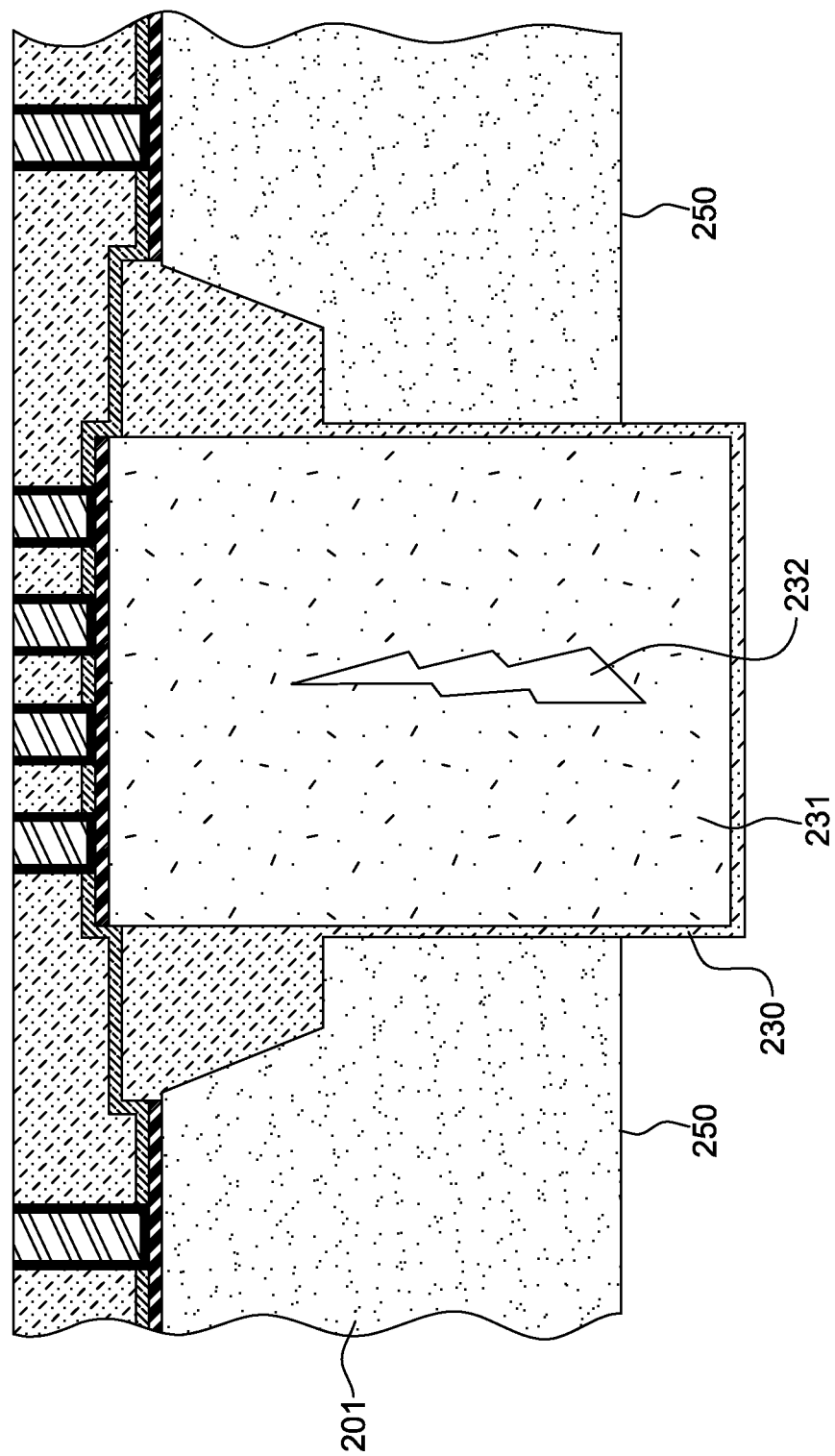
FIG. 2F depicts the semiconductor structure of FIG. 2E, after back-side thinning of the wafer to reveal the recess at least partially filled with the sacrificial material, in accordance with one or more aspects of the present invention.

After active device formation, and typical FEOL, MOL and BEOL process flows, processing continues with TSV wafer thinning and a back-side reveal process, to (in one example) obtain the semiconductor structure depicted in FIG. 2F. In this process flow, the wafer may be flipped and temporarily bonded to a carrier for thinning close to the TSV recess, with the final TSV reveal being by silicon wet or dry etching selective to the TSV dielectric 230. Thinning close to the TSV recess could be performed by course-grinding, then fine-grinding the back-side of the wafer close to the bottom of the TSV recess. By way of example, a 650-700 micron wafer may be thinned to approximately 50 microns.

As illustrated in FIG. 2G, a planarizing oxide deposition 251 is performed over the back surface 250 of wafer 201 and CMP processing at the back-side of the wafer opens the TSV recess to reveal sacrificial material 231. Note that enough of the TSV recess should be polished away to ensure a non-reentrant profile for the conductive fill.

Figure 2H:
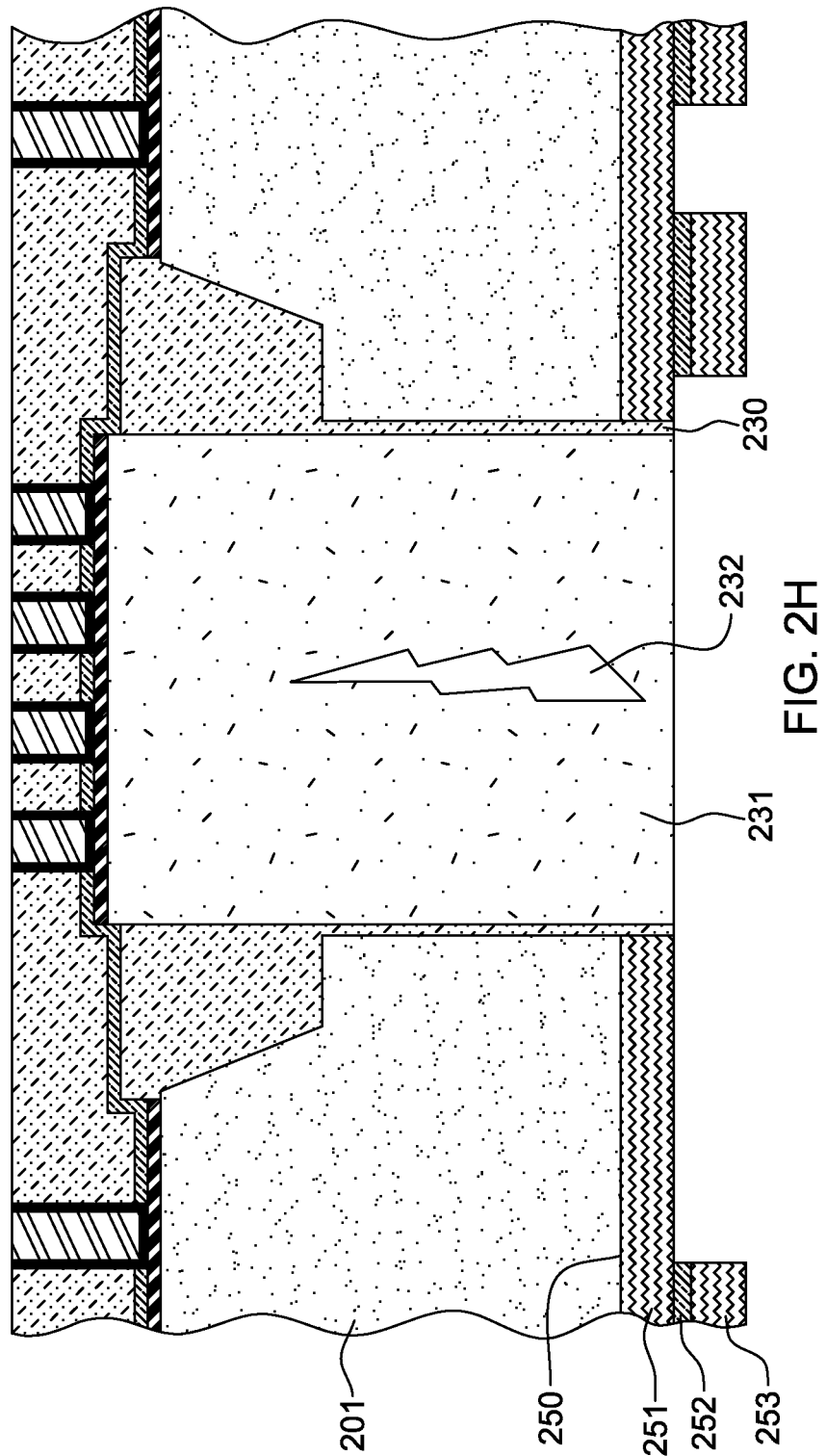
FIG. 2H depicts the semiconductor structure of FIG. 2G, after further optional back-side processing, to facilitate an RDL damascene process, in accordance with one or more aspects of the present invention.

Optionally, at this point in the process, back-side isolation structure processing could be performed to prepare for dual damascene formation of the back-side metallization and the TSV conductive material fill. As illustrated in FIG. 2H, these layers may include a stop layer 252 and an inter-layer dielectric (ILD) deposition 253, along with patterning and etching of the ILD and stop layer, to achieve the desired, back-side metallization mask. Note the use of dual damascene processing in forming the through substrate vias, is an advantage of the first-and-last approach described herein over those TSV approaches initially discussed.

Figure 2I:
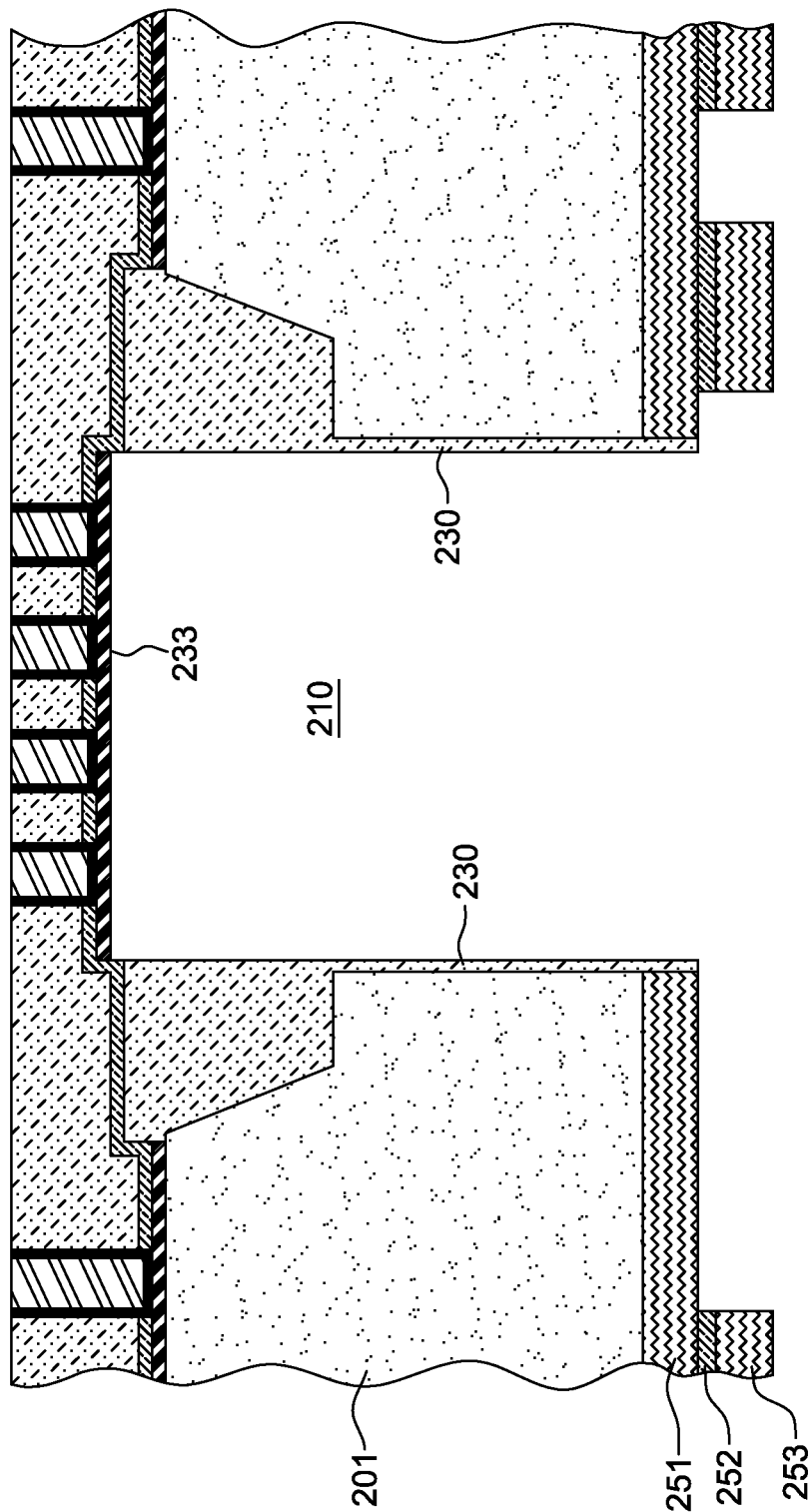
FIG. 2I depicts the semiconductor structure of FIG. 2H, after removing from the back-side of the wafer the sacrificial material from the recess, in accordance with one or more aspects of the present invention.

As illustrated in FIG. 2I, the sacrificial material (e.g., polysilicon) is removed by a wet or isotropic dry etch, exposing TSV recess 210 from the back-side of the wafer. As noted, one or more fill voids in the sacrificial material within the TSV recess will accelerate this process. By providing the fill voids, etching proceeds, at least partially, outwardly from the center fill void in the direction of the diameter of the recess, as opposed to only etching the depth of the recess. Note also, that the sacrificial material strip chemistry should not attack the CA barrier and the MOL barrier on the front-side of the wafer.

Figure 2J:
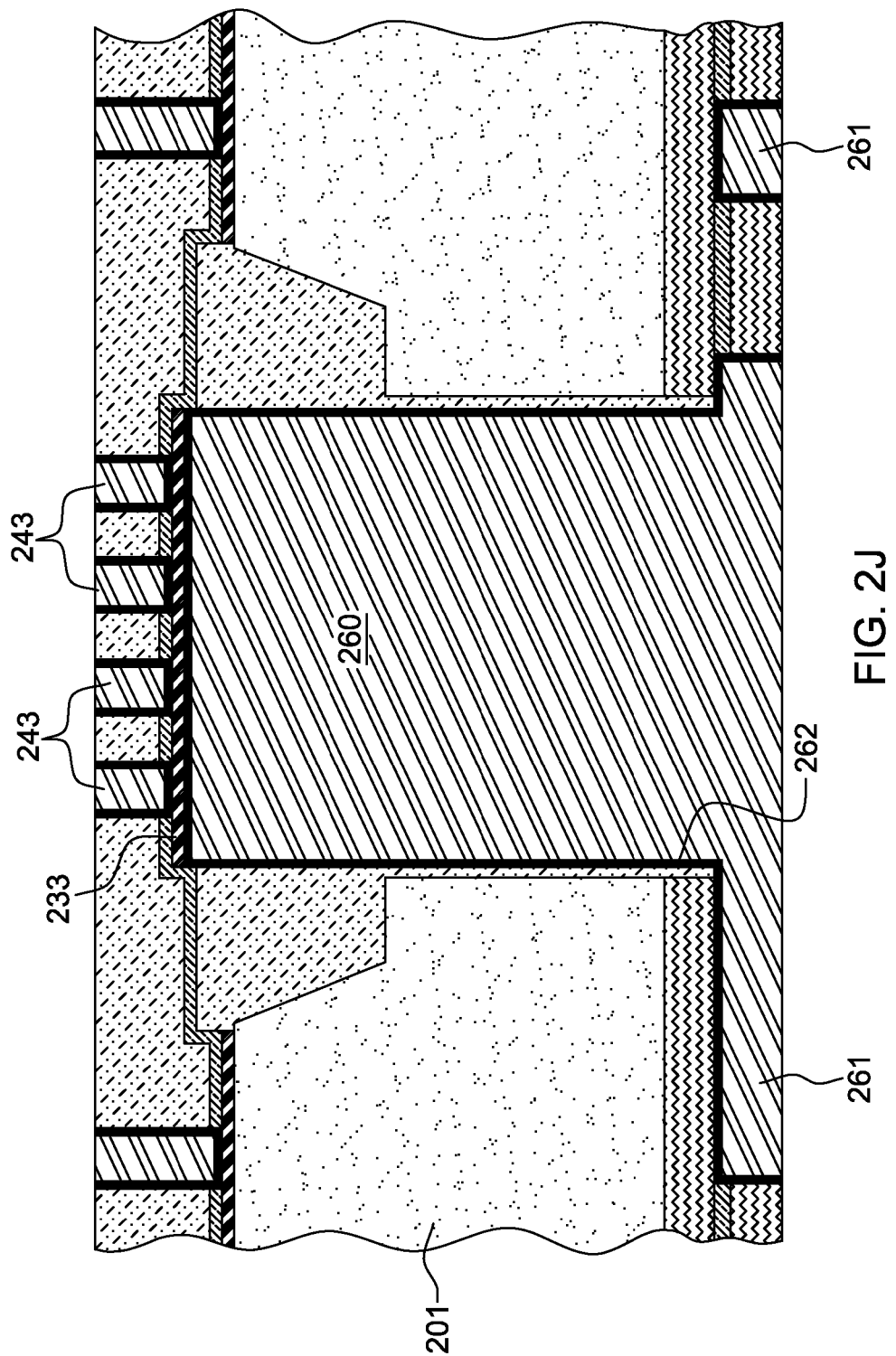
FIG. 2J depicts the semiconductor structure of FIG. 2I, after depositing a barrier layer, and filling the recess from the back-side of the wafer with a conductive material, to provide the through substrate via concurrent with, in the example depicted, formation of a back-side, line-level metallization, in accordance with one or more aspects of the present invention.

As illustrated in FIG. 2J, subsequent to sacrificial material removal from the TSV recesses, standard deposition of a diffusion barrier 262, conductive material seeding and plating, followed by CMP polishing of the conductive material back may be employed to achieve, substantially concurrently, the final through substrate via with the conductive material 260, as well as a first-level, back-side metallization layer 261. In one embodiment, the conductive material is copper. Note that using this approach filling the TSV recess with the conductive material occurs after substantially all high-temperature processing of the wafer has been completed, so that there is no likelihood of the conductive material expanding and creating stresses in the active devices during, for example, front-side processing of the wafer.

Those skilled in the art should also note that details of the process sequence and choice of materials, etc., can be varied, without departing from the scope of the invention disclosed herein. Advantageously, the TSV processing integration approach presented combines various advantages of other TSV approaches, while avoiding the shortcomings of the existing approaches. The TSV-first-and-last approach presented herein enables TSV-first processing, without limitation on the conductive fill material employed within the TSV, which enables creation of copper TSVs. Current TSV-first approaches are restricted to using silicon or tungsten as the conductive fill, which have significantly higher resistance than, for example, copper. Further, the approach disclosed herein differs from TSV-mid or TSV-last processing in that TSV-mid or TSV-last processings can impact the fabricated active devices through stress, thermal budget, etc. Further, the TSV-last process from the wafer back-side requires a difficult contact open etch, and alignment, in comparison to the approach disclosed herein.

Figure 3:
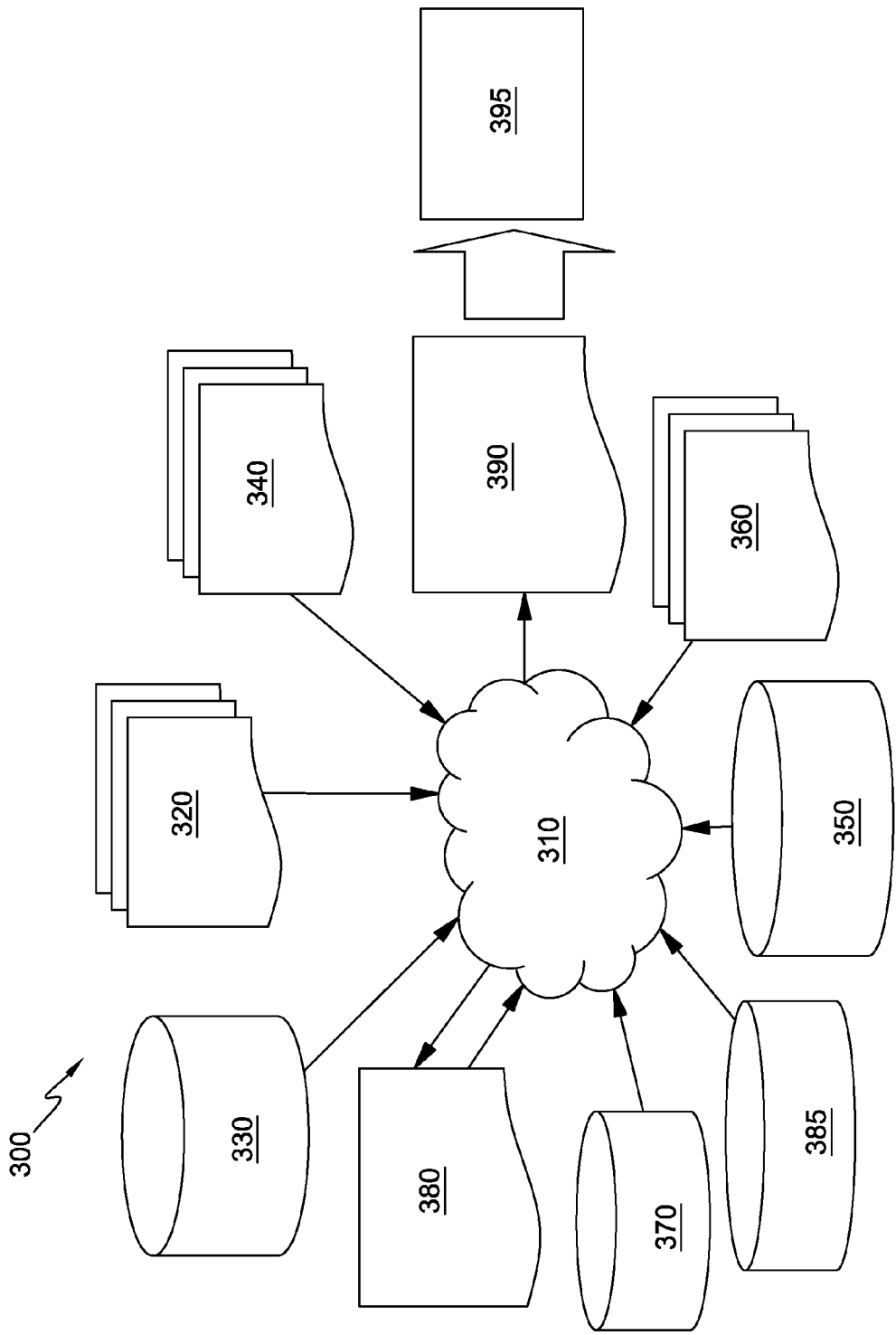
FIG. 3 depicts one embodiment of a flow diagram of a design process which may be employed in semiconductor design and manufacture of semiconductor structures, in accordance with one or more aspects of the present invention.

FIG. 3 depicts a block diagram of an exemplary design flow 300 used, for example, in semiconductor circuit design, simulation, test, layout, and manufacture. Design flow 300 includes processes and mechanisms for processing design structures or devices to generate logically or otherwise functionally-equivalent representations of the processes, design structures and/or devices described above and shown in FIGS. 1-2J. The design structures and/or processes generated by design flow 300 may be encoded on machine-readable transmission or storage media to include data and/or instructions that, when executed or otherwise processed on a data processing system, generate a logically, structurally, mechanically, or otherwise functionally-equivalent representation of hardware components, circuits, devices, or systems. Design flow 300 may vary, depending on the type of representation being designed. For example, a design flow for building an application specific integrated circuit (ASIC) may differ from a design flow for designing a standard component, or from a design flow for instantiating the design into a programmable array, for example, a programmable gate array (PGA) or field programmable gate array (FPGA) offered by Altera®, Inc., or Xilinx®, Inc.

FIG. 3 illustrate multiple such design structures, including an input design structure 320 that is processed by a design process 310. Design structure 320 may be a logical simulation design structure, generated and processed by design process 310 to produce a logically, equivalent-functional representation of a hardware device. Design structure 320 may also, or alternately, comprise data and/or program instruction that, when processed by design process 310, generate a functional representation of the physical structure of a hardware device. Whether representing functional and/or structural design features, design structure 320 may be generated using electronic computer-aided design (ECAD), such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device or system, such as those shown in FIGS. 1-2J. As such, design structure 320 may comprise files or other data structures, including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL), design entities, or other data structures conforming to and/or compatible with lower-level HDL design languages, such as Verilog and VHDL, and/or higher-level design languages, such as C or C++.

Design process 310 may employ and incorporate hardware and/or software modules for synthesizing, translating, or otherwise processing a design/simulation functional equivalent of the components, circuits, devices or logic structures shown in FIGS. 1-2J to generate a netlist 380, which may contain design structures, such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an interactive process in which netlist 380 is re-synthesized one or more times, depending on design specifications and parameters for the device. As with other design structure types described herein, netlist 380 may be recorded on a machine-readable data storage medium, or programmed into a programmable gate array. The medium may be a non-volatile storage medium, such as a magnetic or optical disk drive, a programmable gate array, a compact flash, or other flash memory. Additionally, or in the alternative, the medium may be a system cache memory, buffer space, or electrically or optically conductive devices and materials on which data packets may be transmitted and intermediately stored via the Internet, or other networking suitable means.

Design process 310 may include hardware and software modules for processing a variety of input data structure types, including netlist 380. Such data structure types may reside, for example, within library elements 330 and include a set of commonly used elements, circuits, and devices, including modules, layouts, and symbolic representations, for a given manufacturing technology (e.g., different technology nodes, 32 nm, 45 nm, etc.). The data structure types may further include design specifications 340, characterization data 350, verification data 360, design rules 370, and test data files 385, which may include input test patterns, output test results, and other testing information. Design process 310 may further include, for example, standard mechanical design processes, such as stress analysis, thermal analysis, mechanical event simulation, process simulations for operations, such as casting, molding, and die press forming, etc. One of ordinary skill in the art of mechanical design can appreciate the extent of possible mechanical design tools and applications used in design process 310, without deviating from the scope and spirit of the invention. Design process 310 may also include modules for performing standard circuit design processes, such as timing analysis, verification, design rule checking, place and route operations, etc.

Design process 310 employs and incorporates logical and physical design tools, such as HDL, compilers and simulation module build tools to process design structure 320 together with some or all of the depicted supporting data structures, along with any additional mechanical design of data (if applicable), to generate a second design structure 390. Design structure 390 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 320, design structure 390 may comprise one or more files, data structures, or other computer-encoded data or instructions that reside on transmission or data storage media, and that when processed by an ECAD system, generate a logically or otherwise functionally-equivalent form of one or more of the embodiments of the invention. In one embodiment, design structure 390 may comprise a compiled, executable HDL simulation model that functionally simulates the processes and devices shown in FIGS. 1-2J.

Design structure 390 may also employ a data format used for the exchange of layout data of integrated circuits and/or symbolic data format (e.g., information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure, such as described above and shown in FIGS. 2A-2J. Design structure 390 may then proceed to stage 395, where, for example, design structure 390 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
 providing at least one through substrate via (TSV) through a substrate, the providing comprising:
  forming at least one recess in a first side of a wafer;
  filling, at least partially, the at least one recess with a sacrificial material, wherein the filling, at least partially, the at least one recess with the sacrificial material comprises establishing, during the filling, at least one fill void within the sacrificial material within the at least one recess;
  thinning the wafer from a second side to reveal the at least one recess at least partially filled with the sacrificial material;
  removing, from the second side of the wafer, the sacrificial material from the at least one recess; and
  filling the at least one recess from the second side of the wafer with a conductive material to provide the at least one through substrate via.

2. The method of claim 1, wherein the first side is a front-side of the wafer and the second side is a back-side of the wafer, the front-side being an active device side of the wafer.

3. The method of claim 2, wherein the forming of the at least one recess, and the filling, at least partially, of the at least one recess with the sacrificial material, are performed prior to formation of one or more active devices in the front-side of the wafer, and the removing of the sacrificial material from the at least one recess and the filling of the at least one recess with the conductive material are performed after formation of the one or more active devices in the front-side of the wafer.

4. The method of claim 1, wherein the establishing comprises controlling the filling, at least partially, of the at least one recess with the sacrificial material so that the at least one fill void is enclosed within the sacrificial material within the at least one recess.

5. The method of claim 1, wherein forming the at least one recess in the first side of the wafer comprises forming the at least one recess to extend a predetermined distance into the wafer from the first side of the wafer.

6. The method of claim 5, wherein one recess of the at least one recess comprises substantially vertical side walls extending from the first side into the wafer or re-entrant side walls which facilitate the subsequent filling of the at least one recess from the second side of the wafer with the conductive material.

7. The method of claim 1, further comprises implementing the forming of the at least one recess in the first side of the wafer, and the filling, at least partially, the at least one recess with the sacrificial material within a shallow trench isolation (STI) process module employed in forming the structure.

8. The method of claim 1, wherein prior to the filling, at least partially, the at least one recess with the sacrificial material, the method comprises depositing a dielectric liner within the at least one recess formed in the front-side of the wafer.

9. The method of claim 1, wherein the conductive material comprises copper.

10. A method comprising:
 providing at least one through substrate via (TSV) through a substrate, the providing comprising:
  forming at least one recess in a first side of a wafer;

filling, at least partially, the at least one recess with a sacrificial material;

thinning the wafer from a second side to reveal the at least one recess at least partially filled with the sacrificial material;

removing, from the second side of the wafer, the sacrificial material from the at least one recess;

filling the at least one recess from the second side of the wafer with a conductive material to provide the at least one through substrate via;

wherein after the filling, at least partially, the at least one recess with the sacrificial material, and before the removing from the second side of the wafer the sacrificial material from the at least one recess, the method further includes forming one or more conductive contacts for the at least one through substrate via, the one or more conductive contacts being formed at the first side of the wafer over the at last one recess with the sacrificial material and providing electrical contact to the conductive material once filled within the at least one recess from the second side of the wafer; and wherein the sacrificial material comprises polysilicon, and the method further comprises forming a silicide layer in the polysilicon at the first side of the wafer before forming the one or more conductive contacts for the at least one through substrate via, wherein the one or more conductive contacts formed for the at least one through substrate via electrically contact the silicide layer, and the removing comprises removing the polysilicon, from the second side of the wafer, from the at least one recess, leaving the silicide layer.

11. A method comprising:

providing at least one through substrate via (TSV) through a substrate, the providing comprising:

forming at least one recess in a first side of a wafer;

filling, at least partially, the at least one recess with a sacrificial material;

thinning the wafer from a second side to reveal the at least one recess at least partially filled with the sacrificial material;

removing, from the second side of the wafer, the sacrificial material from the at least one recess;

filling the at least one recess from the second side of the wafer with a conductive material to provide the at least one through substrate via; and wherein filling the at least one recess from the second side of the wafer with the conductive material comprises utilizing a dual damascene process to till the at least one recess from the second side of the wafer with the conductive material and concurrently form a second side, line-level metallization at the second side of the wafer.

\* \* \* \* \*

UNITED STATES PATENT AND TRADEMARK OFFICE
CERTIFICATE OF CORRECTION

| | |
|---|---|
| PATENT NO. | : 8,614,145 B2 |
| APPLICATION NO. | : 13/325191 |
| DATED | : December 24, 2013 |
| INVENTOR(S) | : Klaus Hummer |

Page 1 of 1

It is certified that error appears in the above-identified patent and that said Letters Patent is hereby corrected as shown below:

In the Claims

Column 12, Line 22: Claim 11 Delete "till" and insert --fill--

Signed and Sealed this
Eleventh Day of March, 2014

Michelle K. Lee
*Deputy Director of the United States Patent and Trademark Office*